United States Patent [19]

Hed

[11] Patent Number: 5,232,516
[45] Date of Patent: Aug. 3, 1993

[54] THERMOELECTRIC DEVICE WITH RECUPERATIVE HEAT EXCHANGERS

[75] Inventor: Aharon Z. Hed, Nashua, N.H.

[73] Assignee: Implemed, Inc., Brookline, Mass.

[21] Appl. No.: 710,100

[22] Filed: Jun. 4, 1991

[51] Int. Cl.$^5$ .............................................. H01L 35/28
[52] U.S. Cl. .................... 136/204; 136/203; 136/211; 136/212; 136/224; 136/225; 62/3.2; 62/3.3; 62/3.6
[58] Field of Search ............... 136/203, 204, 205, 208, 136/209, 210, 211, 212, 224, 225; 62/3.2, 3.3, 3.6

[56] References Cited

U.S. PATENT DOCUMENTS

| | | | |
|---|---|---|---|
| 2,938,357 | 5/1960 | Sheckler | 62/3 |
| 2,986,009 | 5/1961 | Gaysowski | 62/3 |
| 3,040,538 | 6/1962 | Alsing | 62/3 |
| 3,077,080 | 2/1963 | Pietsch | 62/3.3 |
| 3,138,934 | 6/1964 | Roane | 62/3 |
| 3,212,275 | 10/1965 | Tillman, Jr. | 62/3 |
| 3,212,999 | 10/1965 | Sommers, Jr. | 202/163 |
| 3,213,630 | 10/1965 | Mole | 62/3 |
| 3,324,667 | 6/1967 | Muller | 62/3 |
| 3,527,621 | 9/1970 | Newton | 136/203 |
| 4,125,122 | 11/1978 | Stachurski | 136/205 |
| 5,057,490 | 10/1991 | Skertic | 505/1 |

FOREIGN PATENT DOCUMENTS

| | | | |
|---|---|---|---|
| 233911 | 3/1960 | Australia | 62/3.3 |
| 980458 | 1/1965 | United Kingdom | 62/3.3 |

*Primary Examiner*—Donald P. Walsh
*Assistant Examiner*—Chrisman D. Carroll
*Attorney, Agent, or Firm*—Eliot S. Gerber

[57] ABSTRACT

Thermoelectric heat pumps using recuperative heat exchange are described. These devices use sets of thermocouples (thermoelectric couples) arranged side-by-side to form a plate. The plate is positioned in a fluid-containing vessel and heat exchanging fluid is flowed down one side of the plate and up the other side. In these devices the heat flow, and thus the driving thermal gradient on each thermoelectric couple in the device, is in a direction from one side of the plate to the other side, i.e., other than the direction of the device's working thermal gradient, which is the direction of the flow of fluid. Generally these two directions (driving gradient on the thermoelectric couples and fluid flow-working thermal gradient) are essentially orthogonal to each other.

9 Claims, 9 Drawing Sheets

THERMOELECTRIC DEVICE WITH RECUPERATIVE HEAT EXCHANGERS

BACKGROUND OF THE INVENTION

1. Field of the Invention

The present invention relates to thermoelectric based heat pumps and refrigerating systems.

2. Related Art

In a recent patent application (Ser. No. 07/626,986 which is incorporated herein by reference), there is described a device in which thermoelectric cells are utilized to greatly increase the thermodynamic efficiency of heat pumps and refrigerators using such cells. The thermal gradient on each cell is very small and the temperature lift achieved by the system is very large. To achieve this it uses a recuperative heat exchanging medium which established the temperature lift in a direction other than the direction of heat flow within the system's thermocouples (usually orthogonal to the heat flow). In that same patent application cylindrical structures were disclosed in which the devices, temperature gradient is along the axis of symmetry while the heat flow and the current driving each thermocouple within the devices are in the radial direction (and thus orthogonal to the axis). Devices where the cylindrical structure's cross section are polygonal rather than circular were disclosed as well.

While the devices described in Patent Application 07/626,986 are ideally suited for withdrawing heat from a small area at the distal end of an elongated tube, or when a number of these devices are assembled to create a refrigerator or heat pump, space utilization is not always optimized due to the radial symmetry of current and heat flow in each thermocouple. Consequently, the space between different devices assembled in parallel may not be optimized.

Furthermore manufacturing the devices from planar sheets of "microthermocouples" that are bent into cylindrical structures may be more costly than the devices of the instant invention.

SUMMARY OF THE INVENTION

In the instant invention a plurality of thermoelectric couples are assembled as flat strips. All the intracouple junctions are on one side (the "cold side") and all the intercouples junctions are on the other side (the "warm side"). A large number of such strips are assembled side-by-side to form a flat plate with all their cold sides on one plane and their warm sides on the opposing plane. Neighboring strips are essentially thermally isolated from each other. The plate is then inserted into a vessel to divide the vessel space into a "cold" side and a "warm" side. These two spaces are separated by the structure of thermoelectric cells except that at the distal end the two spaces are connected by a fluid path for the flow of a heat exchanging fluid.

A DC current is passed through the assembly of thermoelectric cells so that all the intracouple junctions are cooled. Simultaneously, a heat exchanging fluid is pumped, or flows, in a direction orthogonal to the thermoelectric strips, with the fluid flow being toward the distal end (on the cold side) and the fluid returning on the warm side. In this configuration, the heat exchanging fluid is progressively cooled in its flow over the cold side and progressively warmed in its flow over the warm side. The thermal gradient on each thermoelectric couple (and on each strip) between their respective cold and warm sides is very small. However, the thermal gradient on the heat exchanging fluid, in its direction of flow, may be very large and depends on the number of strips used in a particular device. The thermoelectric heat pump normally operates with a very small thermal gradient on the individual thermoelectric cells and thus operates at very high efficiency.

This unique feature overcomes a major shortcoming of traditional thermoelectric devices: that the efficiency declines very rapidly with the thermal gradient applied on the devices.

OBJECTIVES OF THE INVENTION

It is the primary object of the instant invention to provide a thermoelectric heat pump having a plurality of thermoelectric couples assembled as a number of independent strips which is operated with a recuperative heat exchanging medium so that the thermal gradient on each couple is extremely small, yet, the temperature lift on the assembly is large.

It is another object of the instant invention to provide assemblies of such devices operating as heat pumps or refrigerators.

It is yet another object to increase the efficiency of a multi-element thermoelectric refrigerator by operating each thermocouple of the device at a minimal thermal gradient.

It is another object of the instant invention to provide a multi-element thermoelectric device capable of efficiently extracting low grade heat (150° F. to 500° F.) from a fluid and converting such heat to electricity.

BRIEF DESCRIPTION OF THE DRAWINGS

Other objects and features of the present invention will be apparent from the following detailed description taken in conjunction with the accompanying drawings.

In the drawings.

DESCRIPTION OF THE PREFERRED EMBODIMENTS

Figure 1:
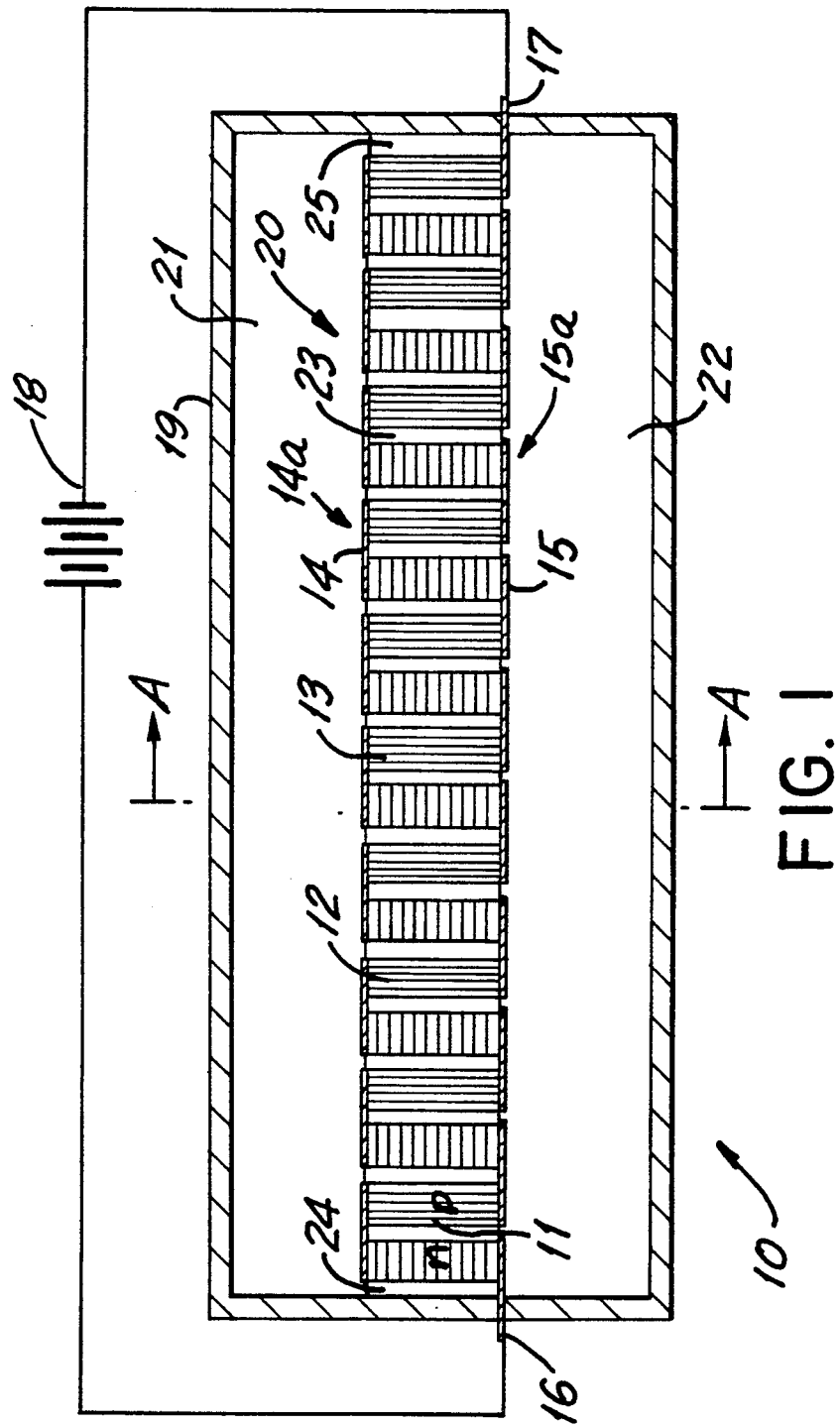
FIG. 1 is a side cross-sectional view of a thermoelectric refrigerator of the present invention.

FIG. 1 shows a cross section through a typical thermoelectric refrigerator 10 of the instant invention. Within the refrigerator thermoelectric couples 11 are connected to each other in series to form a strip 20. Each couple consists of a p leg 13 and an n leg 12; for example, the couple is of doped bismuth telluride. The p and n legs within each couple are connected by conducting elements 14, forming the intracouple junction. The p and n legs of neighboring couples are connected on the opposing plane by intercouple conducting elements 15. All the intracouple junctions 14 of a strip form a plane 14a ("cold plane") and all the intercouple junctions 15 form an opposing plane 15a ("warm plane") When a DC current, in a given direction, is passed through the strip 20 a thermal gradient is developed on the thermocouples and heat will flow from the cold plane 14a to the warm plane 15a. By reversing the direction of the DC current the direction of heat flow will be reversed as well. The strip 20 is terminated by feedthrough electrodes 16 and 17 on opposing ends of the strip 20 which are adapted to be connected to a DC power source 18.

The spaces 23 between the couples and between the legs can be evacuated, in which case electrically insulating support structures, which are good thermal conductors, are provided as the cold and warm planes respectively. Alternatively, as shown in FIG. 1, the spaces 23 are filled with an electrical and thermal insulating material which also provides mechanical support to the strip 20.

The multiple strips 20 are aligned and assembled adjacent to one another in a direction perpendicular to the cross-section shown in FIG. 1, forming a plate having a first side (cold side) and second side (warm side). The plate of strips 20 are enclosed within a closed vessel 19 and the plate divides the vessel inner space into two volumes (spaces). The space 21 ("cold space") is adjacent to the plane containing the intracouple junctions 14 and the space 22 ("warm space") is adjacent the plane containing the intercouple junctions 15.

Examples of assembly methods that can be utilized for such structures are described in detail in the aforementioned application, Patent Application 07/626,986.

To assure optimal operation of the system, the opposing sides of strip 20 (the electrodes 16 and 17 sides) have seals 24 and 25 with the vessel's walls to assure that there is no fluid flow around the strip from the space 21 to space 22.

Figure 2A:
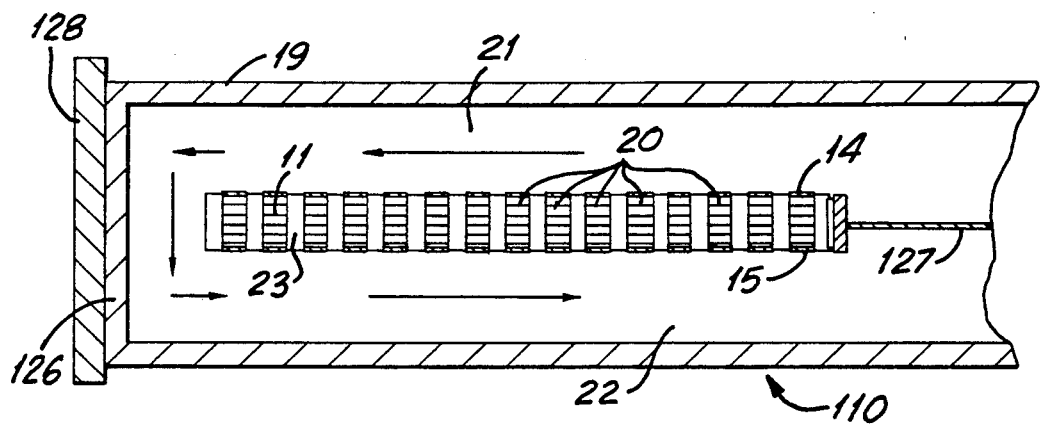
FIG. 2A is a cross-section taken along line A—A of FIG. 1.

A cross section of the refrigerator in plane A is shown in FIG. 2A Here the refrigerator consists of many strips 20 positioned side by side forming the plate, each strip 20 being as described in connection with FIG. 1. The plate separates the vessel into two spaces, the cold space 21 and the warm space 22. The vessel 19 is terminated on the cold end by a cold plate 126. The cold plate 126 is in thermal contact with a thermal load 128. The opposing end (not shown in FIG. 2) includes means to introduce a heat exchanging fluid to the cold space 21 and means to withdraw that fluid from the warm space 22. The fluid may be a gas or liquid and preferably is a silicone fluid. A thermally insulating barrier 127 provides separation of the cold and warm spaces 21 and 22 up to their respective means of heat exchanging fluid introduction and withdrawal.

The operation of the refrigerator is described below and follows the same method of operation as described in our prior patent application Ser. No. 07/626,986. DC power is applied to all the thermocouple strips and the heat exchanging fluid is pumped so that it flows in the space 21 toward the cold end 126. As the heat exchanging fluid flows, the thermoelectric strips gradually withdraw heat from the heat exchanging fluid, and transfer that heat to the warm space 22. As a result, the heat exchanging fluid is cooled to a temperature which essentially scales with the sum of the small thermal gradients on all the strips. When the heat exchanging fluid reaches the cold plate, which is in contact with the thermal load, it reaches a temperature somewhat lower than the thermal load's temperature, and thus is capable of withdrawing heat from the cold load. As the heat exchanging fluid returns through the warm space 22, it is further heated from the heat input from each of the thermoelectric strips. The heat exchanging fluid exits the vessel at a temperature somewhat higher than its entry temperature and is directed to a warm heat exchanger if the fluid is to be recycled through the refrigerator. While the thermal gradient on each strip is kept very low, a large thermal gradient can be achieved in the direction of flow of the heat exchanging fluid.

Because each thermoelectric couple is exposed to a very small thermal gradient about $(T_A-T_C)/N$ where N is the number of strips 20 in the refrigerator, and $T_A$ and $T_C$ are the exiting heat exchanging fluid temperature and the cold plate temperature, respectively, the device operates at optimal efficiency for thermoelectric couples. When planar thermoelectric cells are used, an equivalent lift $(T_A-T_C)$ would require a cascade of N planar cells each with an area progressively larger than the prior cell or, alternatively, a large temperature gradient on a few elements in a cascade. The former solution is expensive and limits the heat pumping capacity of the devices and the latter solution results in device efficiency which is 3 to 10 times lower than the devices of the present invention.

Preferably all the thermocouples within a strip are of the same geometry and have the same electrical characteristics. Consequently, the thermal gradient on all the couples within a strip is the same (the same current passes through all the cells within a strip). The variety of ways that an assembly of strips can be connected electrically is discussed in detail in the cited patent application Ser. No. 07/626,986 which is incorporated herein by reference.

Once steady state is established, the temperature profile within the moving heat exchanging fluid remains constant with time and the heat exchanger is therefore a recuperative heat exchanger. We therefore term this refrigerator a "recuperative heat exchanger assisted thermoelectric refrigerator."

Figure 2B:
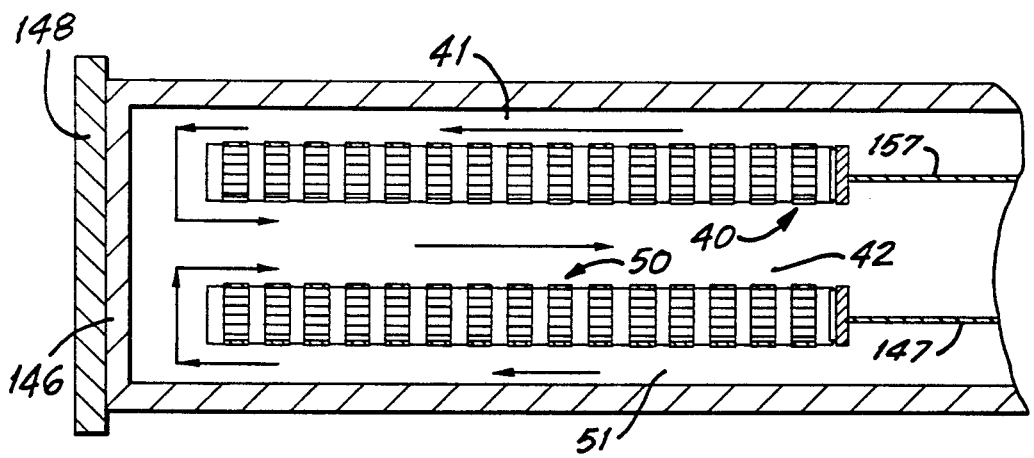
FIG. 2B is a cross-section taken along line A—A of FIG. 5.
Figure 5:
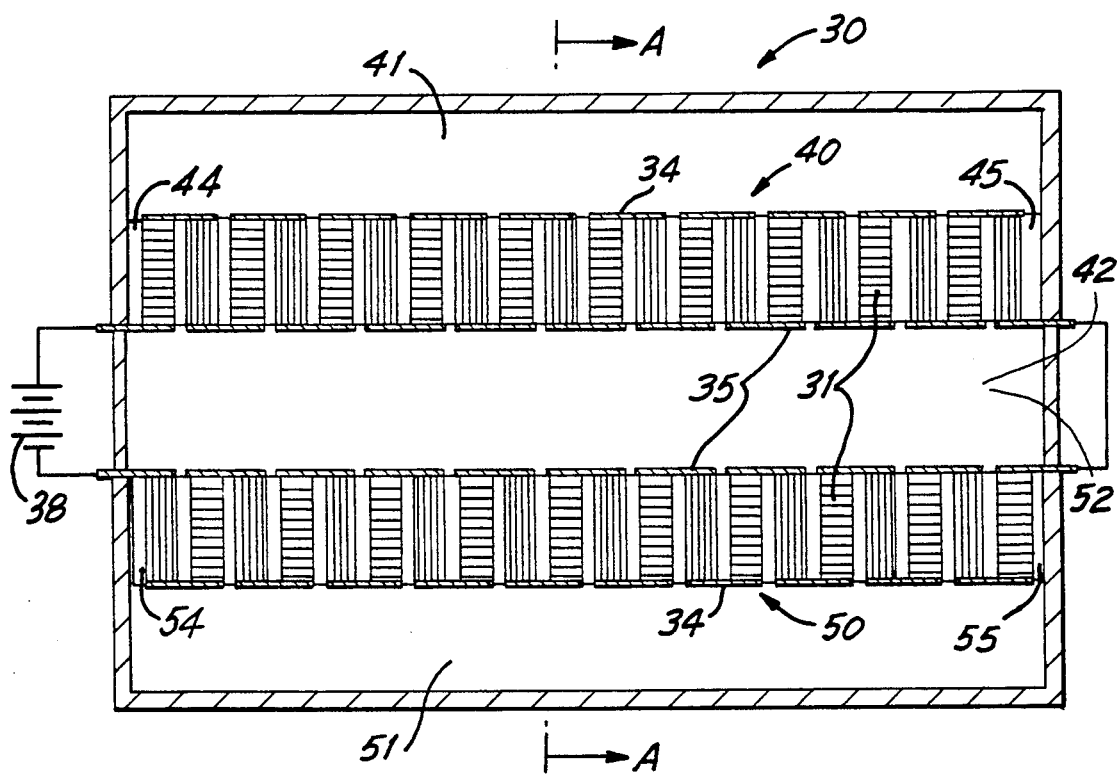
FIG. 5 is a cross-section of an alternative thermoelectric refrigerator of the present invention.

FIG. 5 shows the cross section of a refrigerator 30 in which the inner space is divided into three parts by two plates of thermoelectric strips 40 and 50 respectively. The cross-section in the plane A—A is shown in FIG. 2B. As in FIG. 1, each strip consists of a multiplicity of thermocouples 31 having their intracouple junctions 34 forming cold planes facing the cold spaces 41 and 51 respectively, and their intercouples junctions, 35, facing the warm space (52 and 42 jointly). In this case the warm planes of the two groups of strips face each other, but by reversing the current, or reversing the orientation of the strips, the inner spaces 42, 52 can be made the cold space and the two outer spaces may be made the warm spaces.

FIG. 5 shows the two opposing strips being connected in series, but as discussed in the Patent Application cited above, other electrical wiring schemes can be used as well.

FIG. 2B shows the cross-section of the alternative refrigerator 30. In the configuration depicted, the heat exchanging fluid flows through the spaces 41 and 51 toward the cold plate 146, which is in thermal contact with a thermal load 148. As the heat exchanging fluid moves toward the cold plate 146, it is progressively cooled by each strip of thermocouples and thus reaches a low temperature at the cold plate 146, which is somewhat lower in temperature than the thermal load's temperature. Heat is withdrawn from the load and the heat exchanging fluid returns through the common warm space 42 until it reaches a temperature somewhat above its original entry temperature to the refrigerator. The fluid then passes between the insulating plates 147 and 157 where it is directed to a warm heat exchanger if the fluid is to be recycled within the refrigerator. Heat may be withdrawn at the warm heat exchanger as described in the aforesaid patent application Ser. No. 07/626,986. Alternatively, the warmed fluid may be pumped out as waste fluid to warm an auxiliary device or area.

In the following we explain the similarity and the relationship of the present invention to our patent application Ser. No. 07/626,986. To that end we will often refer to some of the figures in application Ser. No. 07/626,986, and refer to these by their number in application Ser. No. 07/626,986 followed by (986).

Figure 6:
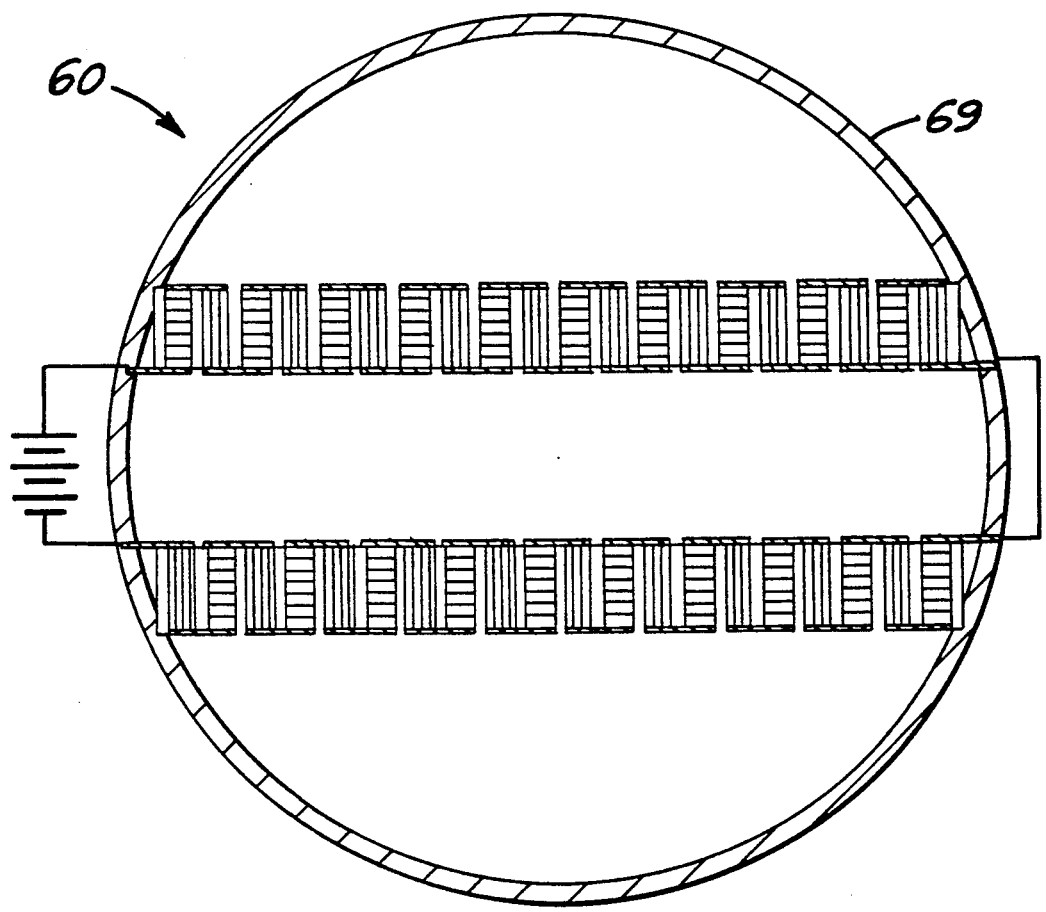
FIG. 6 is a cross-section of an alternative thermoelectric refrigerator of the present invention.

FIG. 6 is a cross section of a device 60 of the instant invention essentially as the device 30 described in FIG. 5, except that the containing vessel 39 of FIG. 5 is replaced with a cylindrical vessel 69.

Figure 3:
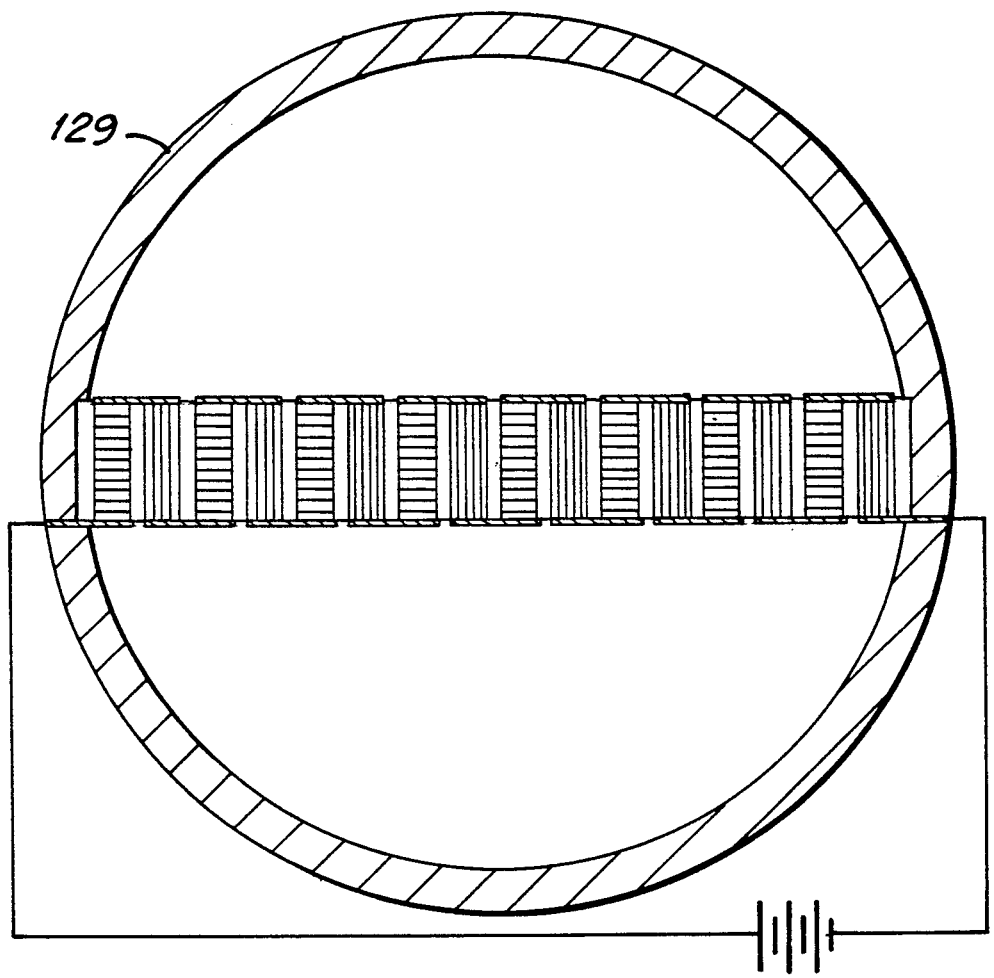
FIG. 3 is a cross-section of an alternative thermoelectric refrigerator of the present invention.
Figure 4:
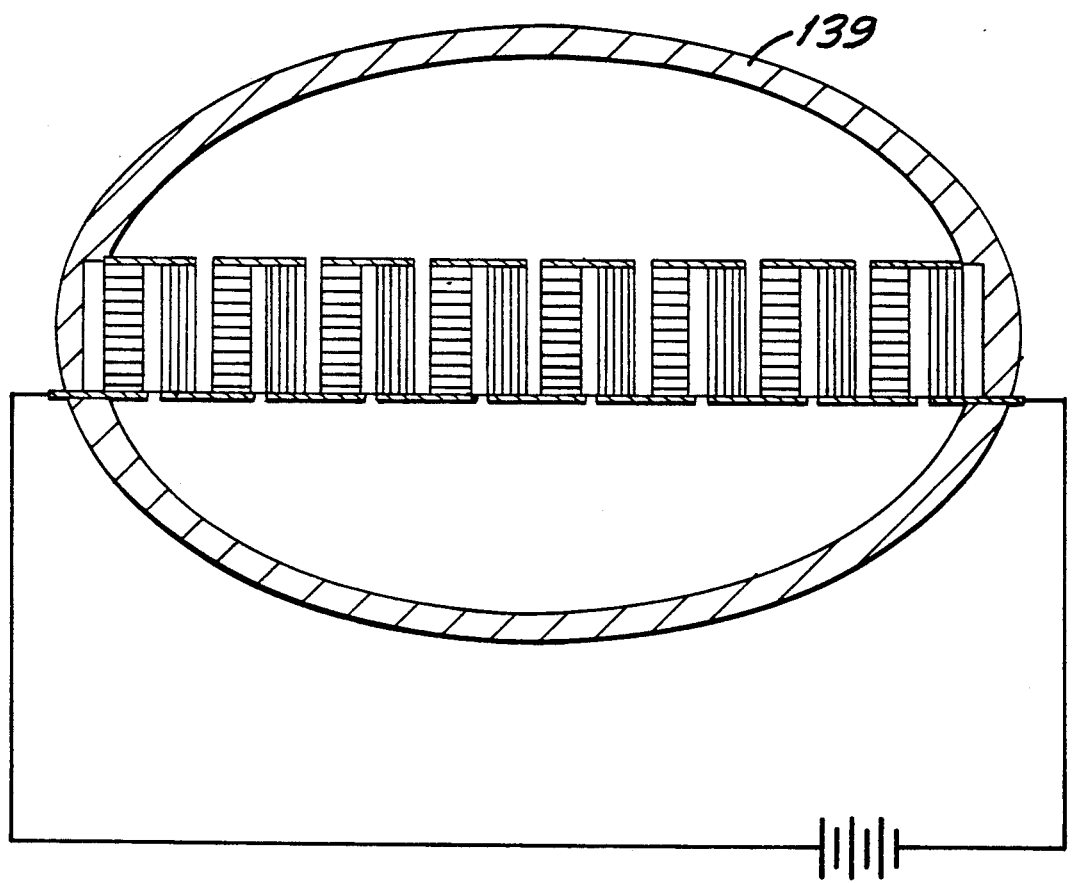
FIG. 4 is a cross-section of an alternative thermoelectric refrigerator of the present invention.

If one cuts, in FIG. 1 (986), the inner supporting element 12 between the couples 11g and 11h, and between 11c and 11d, and straightens the two cell assemblies created in this manner one may obtain a configuration essentially as in FIG. 6 of the present invention. Additional configurations may be obtained by conformal transformation of the containing vessel 69 (in FIG. 6) to vessel 39 in FIG. 5. Elimination of one of the two sets of thermoelectric strips, from FIG. 6 results in FIG. 3, and the device described in FIG. 1 and 4 can be obtained from figure with appropriate conformal transformation of the containing vessel. While the instant invention appears somewhat different than the aforementioned application, it can be derived from said application by transformation and rearrangement of the elements.

Described below is an embodiment of a large scale heat pump of the instant invention, which is equivalent to the embodiment described in figures 5 (986) and 6 (986), except that the thermoelectric cells are arranged in planar geometry, which could facilitate the assembly of large scale refrigeration systems of the instant invention.

Figure 7:
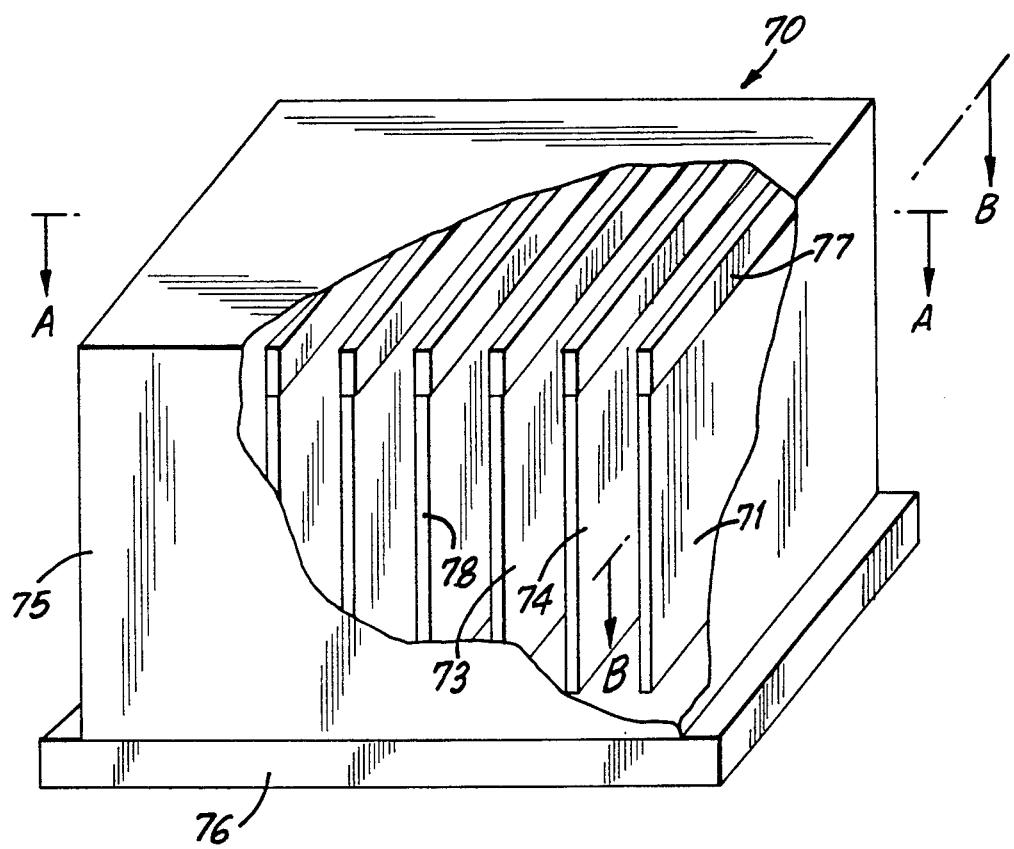
FIG. 7 is a perspective view, partly broken away, of an embodiment of a thermoelectric refrigerator of the present invention.
Figure 8:
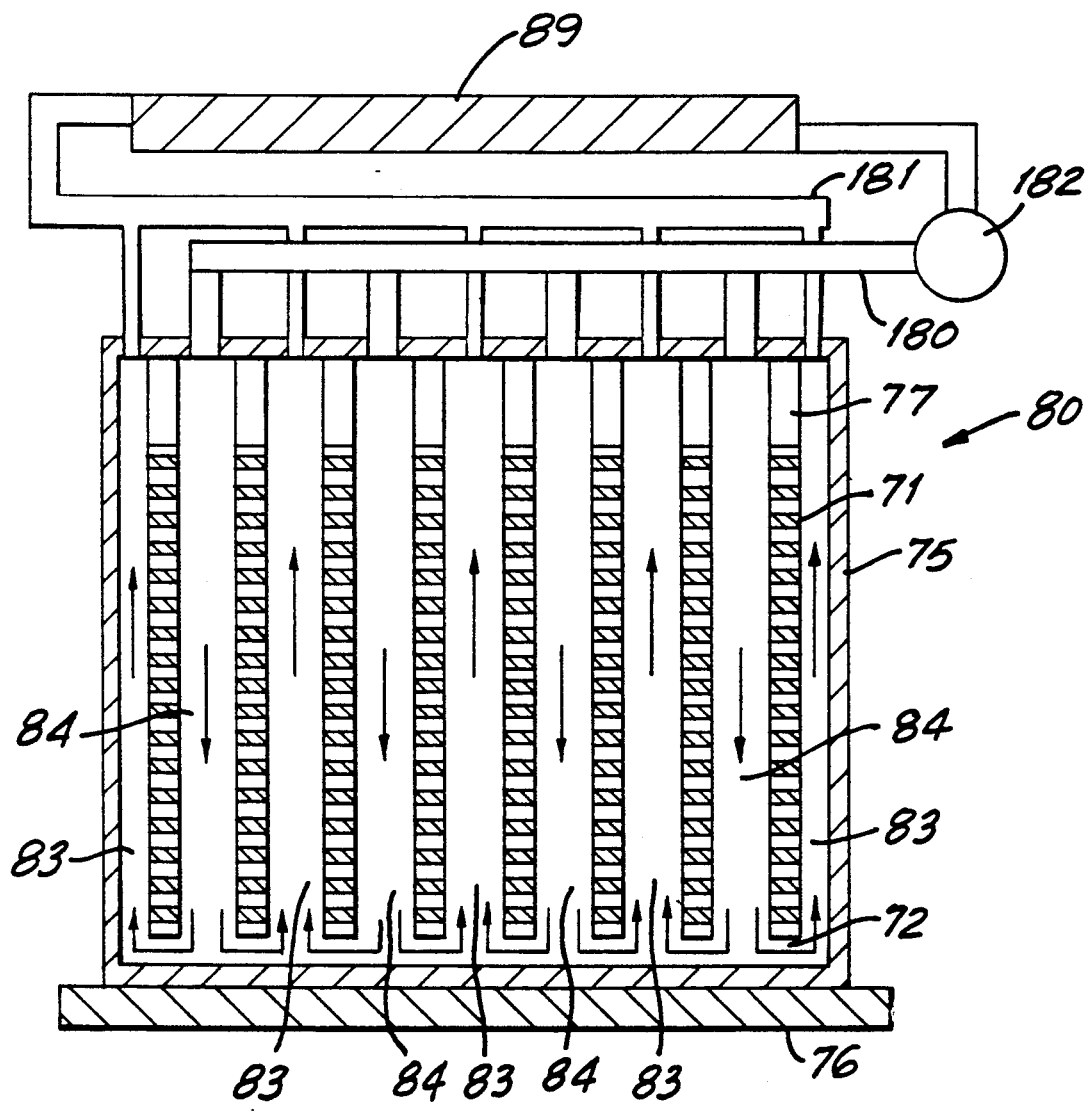
FIG. 8 is a front cross-sectional view of the refrigerator of FIG. 7, taken along line A—A of FIG. 7.

FIG. 7 shows the general structure of the refrigerator 70, without the warm heat exchanger and the piping leading the recuperative heat exchanging fluid in and out of the refrigerator working zone. These are shown in FIG. 8. Within the working zone are a number of parallel plates 71, extending from the top of the vessel 75 to the bottom, except for an open space 72 at the bottom of the plates which allows for fluid movement between the compartments 73 and 74 created between two neighboring plates). The bottom of the vessel is constructed of a good thermal conductor and is in thermal contact with the thermal load 76. All other parts of the vessel 75 are preferentially thermally insulating. The top of each plate 71 is terminated with an insulating element 77 which preferably is an integral part of the plates 71. The edges 78 of the plates 71 form a seal with the side walls of the vessel 75. These seals need not be perfect as long as massive flow of the heat exchanging fluid in the space between the plate and the vessel wall, and thus, between adjacent compartments is prevented.

Figure 9:
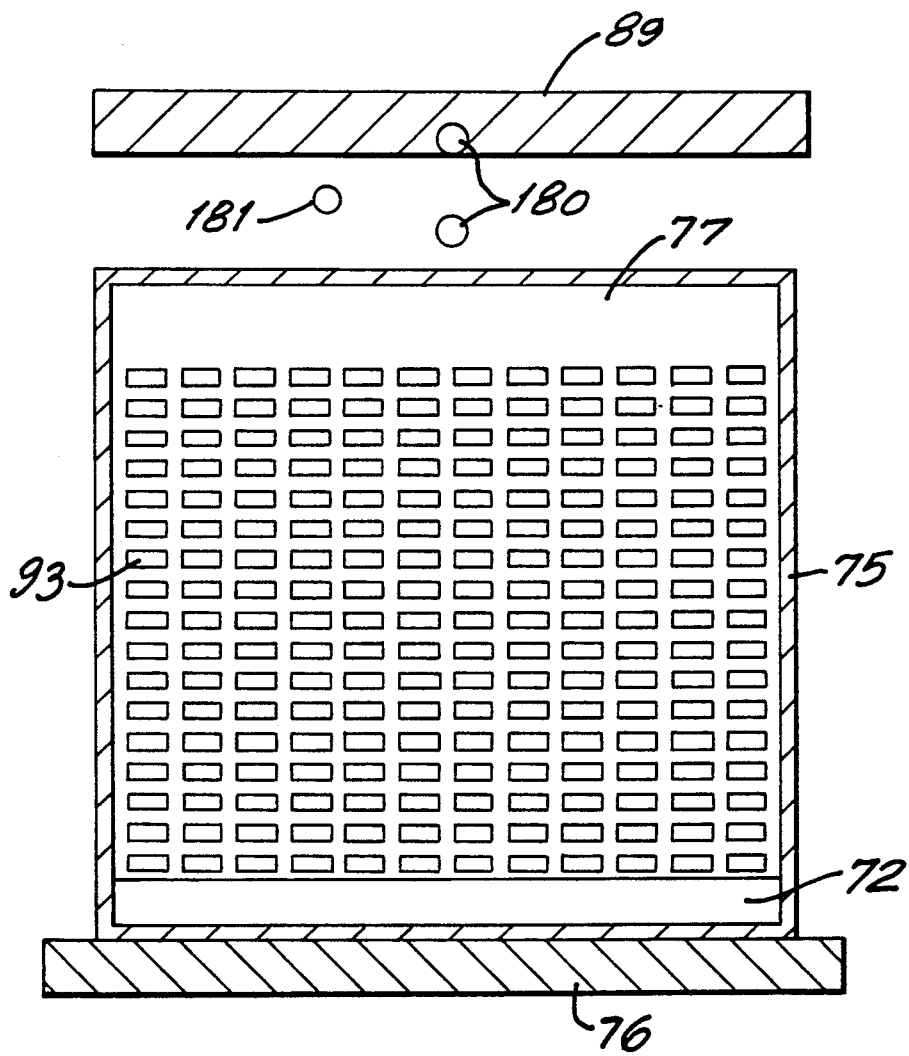
FIG. 9 is a cross-sectional view of the refrigerator of FIG. 7 taken along line B—B of FIG. 7.

To better illustrate the structure of the refrigerator, FIGS. 8 and 9 respectively show cross sections of the refrigerator through planes A and plane B. Plane A passes through all the plates 71 and is perpendicular to the plates, while plane B is through the surface of the rightmost plate 71.

FIG. 8 is a cross-sectional view through the thermoelectric plates 71. These plates 71 consist of strips of thermoelectric elements 88 (essentially as described in FIG. 1) connected in series within each strip. In this specific embodiment each plate 71 consists of 17 such strips assembled side-by-side from the bottom of the plate 71 to the top of the plate, but to allow space for fastening and collection of leads, a segment 71 at the top of the plate is preferably left devoid of thermocouples strips.

A space 72 is left between the bottom of the plates and the bottom part of the enclosing vessel 75 to allow for return flow of the heat exchanging fluid. The bottom plate of the vessel is in thermal contact with the thermal load 76. In the present example we have eight thermoelectric plates 71 separated by compartment spaces B3 and 84. The top of the vessel is equipped with a fluid flow manifold 180 capable of distributing a heat exchanging fluid at ambient temperature, for instance, from the warm heat exchanger to all compartments 84. Another fluid flow manifold 181 collects the heat exchanging fluid that has been heated, for instance, above ambient, from the compartments 83 and delivers the heat exchanging fluid to the warm heat exchanger 89. A variable speed recirculating pump 182 controls the flow rate of the heat exchanging fluid through the system. The heat exchanging fluid's direction of flow is indicated by the arrows. Specifically, this fluid flow is toward the thermal load in the compartments 84 and toward the warm heat exchanger in the compartments 83.

FIG. 9 shows a cross section through the rightmost side of the rightmost plate 71 of FIG. 7. The electrical contacts 93 connect adjacent legs within a thermocouple strip. The cross section of FIG. 9 shows the cold and warm manifolds 180 and 181, respectively.

The operation of the device is as follows: The strips of thermoelectric elements are powered with a DC current source and the fluid heat exchanging medium is pumped to flow down the compartments 84. The electrical current's direction is such that the cold planes of the strips in each plate face the compartments 84 and the warm planes of the strips face the compartments 83. The plates are arranged in "pairs" so that warm planes always face warm planes (and the external enclosure for end plates), while cold planes always face cold planes.

As the fluid moves down the compartments 84, heat is withdrawn from the heat exchanging fluid and transferred to the heat exchanging fluid in the neighboring compartments 83, which fluid is moving in the opposite direction (in this case upward). When the heat exchanging fluid reaches the bottom of the vessel, its temperature has been lowered below the temperature of the thermal load, and thus it can withdraw heat from the load. As the fluid flow from compartments 84 to the compartments 83, and in the process, reverses its flow direction, it absorbs additional heat from the thermocouples in the plates and thus at each point, the fluid temperature in the compartments 83 is somewhat higher than at the opposing side of the plates in the compartments 84. This temperature difference can be made very small by increasing the number of strips, or, alternately, increasing the flow rate of the heat exchanging fluid flow rate.

The total temperature lift achieved is a combination taken over all temperature gradients of the thermocouples in a plate. If the temperature gradient of all the thermocouples within a plate equal each other, the temperature lift is essentially the temperature gradient across a thermocouple multiplied by the number of strips within a plate.

In the presence of a gravitational field (most earth-bound installations) when the heat exchanging fluid is a liquid whose density increases with decreasing temperature, the refrigerator may be operated without the pump 182. When operated in this mode, the cold heat exchanger is positioned on the bottom of the installation and the warm heat exchanger on the top of the installation. A flow of the heat exchanging liquid will be induced by density differences once the thermoelectric couples are powered because, as the liquid is cooled within the compartments 84, it will increase in density and tend to sink toward the cold plates, and as the liquid in the compartments 83 is heated it will decrease in density and thus tend to rise toward the warm heat exchanger. The energy for inducing this flow, which is only the energy required to overcome the conduits' induced drag on the fluid and turbulent flow, is supplied by the power supply that activates the thermoelectric couples. After a short time, a steady state situation is set up in the system, causing flow of the heat exchanging liquid in the correct direction and pumping heat from the thermal load to the warm heat exchanger in a continuous manner.

Other considerations involved with the design, operation and manufacture of the devices described in this disclosure as well as additional applications were discussed in details in the aforementioned patent application Ser. No. 07/626,986.

There are two major advantages of the heat pumps of the present invention relative to the classical compression cycle based refrigerators using chlorofluorocarbon compounds (CFC's or Freons). The first advantage is that the heat exchanging fluid can be any of many low cost unchlorinated and unfluorinated compounds, like water, mixtures of water and glycol, silicone fluids etc., thus reducing the environmental hazard of this refrigeration technology relative to current CFC based compression devices. The second advantage is that the efficiency of the heat pump of the instant invention is only weakly load-dependent when the temperature gradient is constant, because the power to the system can be controlled continuously to respond to thermal load changes. In compression cycles, however, the full efficiency of the heat pump is achieved only at full capacity. When lower thermal loads are desired, the heat pump must operate in the on-off mode, often reducing the overall thermodynamic efficiency by a factor of 2. By increasing the number of discrete strips in a given plate of couples, so that the thermal gradient on each couple is drastically decreased, thermal efficiency exceeding the full load thermodynamic efficiency of compression cycle devices may be achieved, particularly when using highly efficient bismuth-telluride based thermoelectric couples near room temperature.

The device described in FIGS. 7-9 can also be used in the extraction of low grade heat, for example, from discharge water in power plants, and solar panels, and the conversion of such low-grade heat into DC electric power. Currently, these waters are cooled prior to discharge in evaporative towers. The technique could involve the structure of the thermoelectric device as in FIG. 7. In this application, the warm water with an entry temperature above the ambient temperature flows in the vessel in the direction shown by the arrows in FIG. 8, but without recirculation. The thermoelectric couples produce DC electric power which is used by a power usage means, such as the charging of a DC battery, i.e., the electrical system of FIG. 5 in which battery 38 is being charged by the current from the thermoelectric couples.

Two examples of temperature distribution in recuperative heat exchanger based thermoelectric device, according to the present invention, are set forth below.

EXAMPLE 1

The device described in FIG. 2A is constructed with only nine strips 120. The incoming heat exchanging fluid follows the arrows and is cooled by the thermoelectric strips from an entry temperature of 30° C. on the entry side of the insulating barrier 127 to $-10°$ C., when cooled by the last (leftmost) strip in the device. It is assumed that each strip can withdraw the same amount of heat from the heat exchanging fluid, and that the specific heat of the fluid is temperature independent. Under these conditions, and considering that the flow rate, dV/dt, of the heat exchanging fluid is the same throughout, the heat exchanging fluid's temperature will decrease monotonically by the same increment of 5° C. for each consecutive strip within the cold space 122. The temperature of the thermal load is set to be above the lowest temperature of the heat exchanging fluid by the same increment 5° C.

Each strip will transfer heat to the heat exchanging fluid flowing in the warm space 122, equal to $q_o$ for that strip plus the power dissipated within the cell, Ri. This heat can be calculated if the COP (coefficient of performance) is known for each temperature gradient on the strips. The COP, by definition, is the ratio of the rate of heat withdrawal from the cold side to the power required to withdraw the same heat, Ri. The rate of heat discharging on the hot side of the strip is $q_h = q_c + Ri$.

For each strip, $q_h = q_c (1 + 1/COP)$.

In the following Table I the temperature distribution for the 9 strips device is calculated using the COP given in an article entitled "thermoelectric Heat Pumps Cool Packages Electronically" by Dale A. Zeskind (Electronics, Jul. 31, 1980 by McGraw-Hill Inc.)

TABLE I

| i | $T_{ci}$ | $q_{ci}$ | $dT_i$ | $1 + 1/COP$ | $q_{hi}$ | $T_{hi}$ |
|---|---|---|---|---|---|---|
| 9 | $-10$ | 5 | 5 | 1.24 | 6.2 | $-5$ |
| 8 | $-5$ | 5 | 6.2 | 1.26 | 6.3 | 1.2 |
| 7 | 0 | 5 | 7.5 | 1.28 | 6.4 | 7.5 |
| 6 | 5 | 5 | 8.9 | 1.30 | 6.5 | 13.9 |
| 5 | 10 | 5 | 10.4 | 1.34 | 6.7 | 20.4 |
| 4 | 15 | 5 | 12.1 | 1.40 | 7.0 | 27.1 |
| 3 | 20 | 5 | 14.1 | 1.50 | 7.5 | 34.1 |
| 2 | 25 | 5 | 16.6 | 1.62 | 8.1 | 41.6 |
| 1 | 30 | 5 | 18.7 | 1.88 | 9.4 | 49.7 |
| | | outgoing temperature | | | | 59.1 |

In TABLE I the following terms are used:

i, is the order of the strip; $T_{ci}$, the fluid "incoming" temperature at strip i; $q_{ci}$ the heat withdrawn from strip i (up to a constant Cdv/dt, the fluid specific heat multiplied by the fluid's flow rate); $dT_i$ the temperature gradient on each strip; $1 + 1/COP$, the ratio $q_{hi}/q_{ci}$, for strip i; $q_{hi}$, the heat discharged to the fluid by strip i; and the fluid "outgoing" temperature on the hot side at strip i.

In this example, for instance, the heat withdrawn from the cold load $Q_c$ is 5 CdV/dt, while the heat discharged at the hot heat exchanger is (59.1−30)CdV/dt, or $Q_h$=29.1 CdV/dt.

The overall COP of the device is Qc/W, where W is the power input to the system and equal the sum of Ri on all strips is as follows:

$$COP = Q_c/W = Q_c/Q_h - Q_c) = 5/24/1 = 20.75\%$$

The total temperature lift is at least 64.1 of $Q_c$ (59.1+5), and for such a lift the normal COP of a thermoelectric device is under 5%. The device as configured in this Example I thus performs 4 times better than a simple transverse thermoelectric device.

EXAMPLE 2

When keeping the gradient per strip on the cold side constant as in this Example, one needs to optimize the number of strips since too large a number will decrease the terminal temperature gradient and thus the heat withdrawal rate from the cold load. This can be seen from the following Example 2 of 16 strips, and a heat withdrawal rate of only 2.5 c dv/dt from each strip.

| i | $T_{ci}$ | $q_{ci}$ | $DT_i$ | 1 + 1/COP | $q_{hi}$ | $T_{hi}$ |
|---|---|---|---|---|---|---|
| 16 | −7.5 | 2.5 | 2.5 | 1.20 | 3.40 | −5 |
| 15 | −5.0 | 2.5 | 3.0 | 1.21 | 3.0 | −2 |
| 14 | −2.5 | 2.5 | 3.5 | 1.22 | 3.0 | 1 |
| 13 | 0 | 2.5 | 4.0 | 1.23 | 3.1 | 4 |
| 12 | 2.5 | 2.5 | 4.6 | 1.24 | 3.1 | 7.1 |
| 11 | 5.0 | 2.5 | 5.2 | 1.25 | 3.1 | 10.2 |
| 10 | 7.5 | 2.5 | 5.8 | 1.26 | 3.2 | 13.3 |
| 9 | 10.0 | 2.5 | 6.5 | 1.27 | 3.2 | 16.5 |
| 8 | 12.5 | 2.5 | 7.2 | 1.28 | 3.2 | 19.7 |
| 7 | 15.0 | 2.5 | 7.9 | 1.29 | 3.3 | 22.9 |
| 6 | 17.5 | 2.5 | 8.7 | 1.30 | 3.3 | 26.2 |
| 5 | 20.0 | 2.5 | 9.5 | 1.32 | 3.3 | 29.5 |
| 4 | 22.5 | 2.5 | 10.3 | 1.34 | 3.3 | 32.8 |
| 3 | 25.0 | 2.5 | 11.1 | 1.37 | 3.4 | 36.1 |
| 2 | 27.5 | 2.5 | 12.0 | 1.40 | 3.5 | 39.5 |
| 1 | 30.0 | 2.5 | 13.0 | 1.44 | 3.6 | 43.0 |
| | | | outgoing temperature | | | 46.6 |

The overall COP of this device, where W is the power input to the system and equal the sum of Ri on all strips is as follows:

$$COP = Q_c/W - Q_c/Q_h - Q_c) = 2.5/(16.6 - 2.5) = 17.73\%$$

The total temperature life is at least 51.6° C. (46.6+5), and for such a lift the normal COP of a thermoelectric device is about 12.5% and the advantage is minimal.

I claim:

1. A thermoelectric device operating as a heat pump comprising:
   (i) a vessel forming a liquid-tight container and having a cold end portion thereof adapted to be in thermal contact with an external heat source from which heat is to be withdrawn;
   (ii) a plurality of thermocouples joined into a continuous plate having a first side and a second side opposite thereto, said plate being positioned in the vessel;
   (iii) each thermocouple comprising a leg of p-semiconductive material and a leg of n-semiconductive material, each leg having two ends and each thermocouple having an intra-couple electrical connection means to electrically connect one leg to the other leg of its thermocouple at one end thereof; said intra-couple means being adjacent the first side of the plate;
   (iv) a group of inter-couple connection means to electrically connect adjacent couples, said inter-couple means being adjacent to the second side of the plate;
   (v) a DC power source connected to each thermocouple adapted to thereby create a thermal gradient from the first side of the plate to the second side of the plate;
   (vi) said plate dividing said vessel into a warm space on the first side of the plate and a cold space on the second side of the plate; and
   (vii) means to flow liquid within the vessel over both sides of the plate from the cold space to the warm space in a continuous and recirculating closed-loop liquid flow path to cool the liquid by contact with the first side of the plate and warm the liquid by contact with the opposite second side of the plate and to flow the cooled liquid into thermal contact with the cold end portion.

2. A thermoelectric device as set forth in claim 1 wherein said flow means includes pump means to flow a stream of liquid over said sides of the plate.

3. A thermoelectric device as in claim 1 wherein the thermocouples are connected together in subsets and the subsets of thermocouples within the plate are connected in series.

4. A thermoelectric device as in claim 3 comprising a plurality of said thermocouple subsets within the plate arranged side-by-side.

5. A thermoelectric device as in claim 1 wherein the thermocouples within the plate are electrically and physically equivalent.

6. A thermoelectric refrigerator comprising:
   (i) a plurality of thermoelectric plates each plate having a plurality of thermocouples positioned in the plate with opposite first and second sides;
   (ii) each thermocouple comprising a leg of p-semiconductive material and a leg of n-semiconductive material, each leg having two ends adapted to have its heat flow directed from said plate first side to said plate second side, each leg being in thermal contact with the plate first side at one of its ends and being electrically connected to the other leg of its thermocouple at its opposite end and adjacent the plate second side, the thermocouples being electrically connected into subsets and subsets of thermocouples within each plate being connected in series;
   (iii) DC power source means connected to each thermocouple to furnish DC power thereto;
   (iv) vessel means to contain said plates and adapted to contain a liquid which flows in a continuous closed-loop recirculating liquid path over said first side of each plate and over said second side of each plate, wherein said vessel means has at least one closed end in thermal contact with an external heat source from which heat is to be withdrawn; and
   (v) flow means to flow said liquid over each of said plates, the flow being in a direction about orthogonal to said direction of thermocouple heat flow, said flow being over one side of each plate toward said closed end and then over the opposite side of each plate in the reverse direction, thereby withdrawing heat form the heat source.

7. A thermoelectric device as set forth in claim 6 wherein said flow means includes pump means to pump said liquid over said sides of each plate.

8. A thermoelectric cell as in claim 6 wherein the thermocouples within each plate are connected in series.

9. A thermoelectric device as in claim 6 comprising a plurality of thermocouples within each plate arranged side-by-side and wherein the thermocouples within each plate are electrically and physically equivalent.

* * * * *